US010164519B2

(12) United States Patent
Senturk et al.

(10) Patent No.: US 10,164,519 B2
(45) Date of Patent: Dec. 25, 2018

(54) SEMICONDUCTOR STACK FOR CONVERTER WITH SNUBBER CAPACITORS

(71) Applicant: ABB Schweiz AG, Baden (CH)

(72) Inventors: Osman Senturk, Turgi (CH); Peter Steimer, Ehrendingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/088,812

(22) Filed: Apr. 1, 2016

(65) Prior Publication Data

US 2016/0218615 A1      Jul. 28, 2016

Related U.S. Application Data

(63) Continuation of application No. PCT/EP2014/071296, filed on Oct. 6, 2014.

(30) Foreign Application Priority Data

Oct. 4, 2013    (DE) .................... 20 2013 104 510 U

(51) Int. Cl.
*H02M 1/34*        (2007.01)
*H01L 25/11*       (2006.01)
(Continued)

(52) U.S. Cl.
CPC ........ *H02M 1/34* (2013.01); *H01L 23/49562* (2013.01); *H01L 23/49568* (2013.01);
(Continued)

(58) Field of Classification Search
CPC .......... H02M 1/34; H02M 7/003; H02M 7/48; H02M 7/515; H02M 7/537;
(Continued)

(56) References Cited

U.S. PATENT DOCUMENTS

| 4,492,975 A | * | 1/1985 | Yamada | ................ | H01L 25/117 |
| | | | | | 257/726 |
| 4,674,024 A | * | 6/1987 | Paice | ..................... | H02M 7/49 |
| | | | | | 363/137 |

(Continued)

FOREIGN PATENT DOCUMENTS

| DE | 202012008739 U1 | 2/2014 |
| EP | 0751612 A2 | 1/1997 |

(Continued)

OTHER PUBLICATIONS

International Search Report and Written Opinion, PCT/EP14/71296, dated Dec. 16, 2014, 7 Pages.

*Primary Examiner* — Fred E Finch, III
(74) *Attorney, Agent, or Firm* — J. Bruce Schelkopf; Taft Stettinius & Hollister LLP

(57) ABSTRACT

A semiconductor stack for a converter comprises two series-connected semiconductor switches; two terminals for connecting a cell capacitor, which are connected to one another by the two semiconductor switches; at least one cooling element arranged between the semiconductor switches; a frame, by which the semiconductor switches and the cooling element are fixed to one another and which provides the terminals; and at least two snubber capacitors which are mechanically fixed to the frame and which are connected in parallel, are connected to the terminals and which in each case form a commutation loop with the semiconductor switches.

13 Claims, 3 Drawing Sheets

(51) Int. Cl.
*H01L 25/07* (2006.01)
*H01L 23/495* (2006.01)
*H01L 29/739* (2006.01)
*H01L 29/74* (2006.01)
*H02M 7/00* (2006.01)
H01L 25/16 (2006.01)
H01L 23/50 (2006.01)
H01L 29/749 (2006.01)
H02M 7/483 (2007.01)

(52) U.S. Cl.
CPC .. *H01L 23/49575* (2013.01); *H01L 23/49589* (2013.01); *H01L 25/074* (2013.01); *H01L 25/117* (2013.01); *H01L 29/7393* (2013.01); *H01L 29/7416* (2013.01); *H02M 7/003* (2013.01); *H01L 23/50* (2013.01); *H01L 25/16* (2013.01); *H01L 29/749* (2013.01); *H01L 2924/0002* (2013.01); *H02M 2007/4835* (2013.01)

(58) Field of Classification Search
CPC ..... H02M 2007/4835; H01L 23/49562; H01L 23/49568; H01L 23/49575; H01L 23/49589; H01L 23/50; H01L 25/074; H01L 25/117
See application file for complete search history.

(56) References Cited

U.S. PATENT DOCUMENTS

| | | | | |
|---|---|---|---|---|
| 4,855,893 A * | 8/1989 | Kratz | ............ | H02M 7/487 363/136 |
| 4,881,159 A * | 11/1989 | Holtz | ............ | H02M 7/487 363/137 |
| 5,045,924 A | 9/1991 | Ikegame | | |
| 5,055,990 A * | 10/1991 | Miki | ............ | H01L 25/165 257/E25.031 |
| 5,383,108 A * | 1/1995 | Okayama | ............ | H02M 7/487 363/137 |
| 5,461,556 A * | 10/1995 | Horie | ............ | H02M 7/487 363/137 |
| 5,982,646 A * | 11/1999 | Lyons | ............ | H02M 1/34 363/128 |
| 5,986,906 A * | 11/1999 | Ramezani | ............ | H01L 25/18 363/136 |
| 6,169,672 B1 * | 1/2001 | Kimura | ............ | H02M 1/34 361/91.8 |
| 6,272,028 B1 * | 8/2001 | Satoh | ............ | H02M 7/48 363/141 |
| 8,269,331 B2 | 9/2012 | Furuta | | |
| 2003/0021131 A1 * | 1/2003 | Nadot | ............ | H02M 1/34 363/55 |
| 2008/0043500 A1 * | 2/2008 | Asano | ............ | H02M 1/34 363/56.12 |
| 2011/0038193 A1 * | 2/2011 | Jacobson | ............ | H01L 24/72 363/131 |
| 2012/0099273 A1 * | 4/2012 | Jacobson | ............ | H01L 23/473 361/689 |
| 2013/0009595 A1 * | 1/2013 | Brown | ............ | F28D 15/0266 320/108 |

FOREIGN PATENT DOCUMENTS

| | | | | |
|---|---|---|---|---|
| EP | 1492220 A2 | | 12/2004 | |
| EP | 2533285 A1 * | | 12/2012 | ......... H01L 23/051 |
| JP | 2001057407 A | | 2/2001 | |
| JP | 2012129309 A | | 7/2012 | |
| WO | WO 0249196 A2 * | | 6/2002 | ......... H02M 7/003 |

* cited by examiner

SEMICONDUCTOR STACK FOR CONVERTER WITH SNUBBER CAPACITORS

FIELD OF THE INVENTION

The invention relates to a semiconductor stack or press pack for a power converter.

BACKGROUND OF THE INVENTION

In many power electronic circuits, the current oscillates or commutates from one semiconductor device to another equivalent semiconductor device via a commutation loop. By way of example, two-level converters comprise two semiconductor switches which are connected to a capacitor and thus with the capacitor form a commutation loop. In general, the commutation loop has a certain leakage inductance produced, for example, by the conductors that connect the semiconductor components and by the inductance of the capacitor.

If a commutation of the current occurs between the two switches, the current does not fall abruptly owing to the leakage inductance, but rather is temporally dependent, which leads to voltage spikes that load the semiconductor switches. Since each semiconductor switch can also block only a limited voltage at its inputs, a high leakage inductance also reduces the performance or switching speed of the two-level converter.

By way of example, a capacitor having a low inductance, such as a film capacitor, for instance, can be chosen in order to reduce the leakage impedance. Moreover, connections having a low inductance, such as, for instance, planar busbars, twisted lines, etc., can be used between the capacitor and the semiconductor switches.

It is also possible to arrange a snubber capacitor (damping capacitor) spatially near the semiconductor switches, which can reduce the size of the commutation loop and thus reduce the leakage inductance.

Power semiconductor switches, which are generally embodied in a planar fashion, are arranged for example together with cooling elements in a stack and can be connected to form a so-called presspack. The presspack or stack can also comprise the snubber capacitor which can be arranged laterally on the presspack or stack.

SUMMARY OF THE INVENTION

It is an object of the invention to provide a semiconductor stack for a converter which is constructed compactly and which has a low leakage inductance in the commutation loop.

This object is achieved by the subject matter of the independent claim. Further embodiments of the invention are evident from the dependent claims and from the following description.

The invention relates to a semiconductor stack for a converter or a half-bridge which, together with a cell capacitor, can form a converter. The semiconductor stack can also comprise a unipolar or bipolar cell (generally without a cell capacitor) for a modular multi-level converter. In this case, a semiconductor stack can be understood to mean a stack of semiconductor elements and further components, such as cooling elements, for instance, which are connected to one another by means of a common frame.

In accordance with one embodiment of the invention, the semiconductor stack comprises two series-connected semiconductor switches, such as, for instance, transistors, thyristors, IGBTs, IGCTs, RC-IGBTs and/or RC-IGCTs; two terminals for connecting a cell capacitor, which are connected to one another by the two semiconductor switches; at least one cooling element arranged between the semiconductor switches; which at least one cooling element can be electrically conductive, for example, and electrically connects the two adjacent semiconductor switches; a frame, by which the semiconductor switches and the cooling element are fixed to one another and which provides the terminals; and at least two snubber capacitors which are mechanically fixed to the frame and which are connected in parallel, are connected to the terminals and which in each case form a commutation loop with the semiconductor switches.

A structurally compact semiconductor stack having a low leakage inductance in the commutation loops can be provided in this way. Since parallel-connected inductances lead to a lower inductance, a plurality of commutation loops, (two, three, four, etc.) lead to a reduction of the leakage inductance. Since a plurality of small capacitors, rather than one large capacitor, can be distributed around the semiconductor stacks, the structural space can additionally be better utilized.

In accordance with one embodiment of the invention, the semiconductor stack further comprises at least four snubber capacitors which are mechanically fixed to the frame. The capacitors can for example be fitted to the semiconductor stack laterally in pairs, for example by means of a common busbar. Two snubber capacitors can be arranged on opposite sides of the semiconductor stacks. Alternatively or additionally, two snubber capacitors can be arranged spatially alongside one another on one side of the semiconductor stack.

In accordance with one embodiment of the invention, the snubber capacitors are embodied such that they are of identical type. The snubber capacitors can have the same shape, the same size and/or the same capacitance. In general, a snubber capacitor will have a cylindrical body with electrical contacts at the ends.

In accordance with one embodiment of the invention, the semiconductor stack further comprises a snubber diode. The parallel-connected snubber capacitors can be connected to one end of the two series-connected semiconductor switches via a diode, which can prevent oscillations or resonances in the commutation loops.

In accordance with one embodiment of the invention, the semiconductor stack further comprises a snubber resistor. The parallel-connected snubber capacitors can be connected to one end of the two series-connected semiconductor switches via a snubber resistor. The snubber resistor can be connected in parallel with the snubber diode.

In accordance with one embodiment of the invention, the semiconductor stack further comprises an inductor inductance (i.e., a choke coil). The inductor inductance can be used for setting or controlling the inductance of the commutation loops and/or of the conductor circuit to the cell capacitor. By way of example, the inductor inductance can be inserted into the commutation loops and/or can connect the snubber resistor to the snubber diode.

In accordance with one embodiment of the invention, the semiconductor stack further comprises a first pair and a second pair of series-connected semiconductor switches, which are connectable in each case in pairs to two cell capacitors. The semiconductor switch can have two series-connected half-bridges or be designed to form two series-connected (partial) converters.

In accordance with one embodiment of the invention, the semiconductor stack comprises at least two first snubber capacitors which are mechanically fixed to the frame and which are connected in parallel and which in each case form a commutation loop with the first pair of semiconductor switches; and at least two second snubber capacitors which are mechanically fixed to the frame and which are connected in parallel and which in each case form a commutation loop with the second pair of semiconductor switches. The semiconductor stack can have a snubber circuit, of the kind as already described above, for each of the half-bridges or partial converters. The components of the two snubber circuits, and in particular the snubber capacitors, can also be fixed to the semiconductor stack laterally.

In accordance with one embodiment of the invention, the (first and/or second) snubber capacitors are connected to one another via a (first and/or second) busbar. In this way, an arrangement of two, four or a plurality of capacitors can be fixed with respect to one another. The (first and/or second) busbar can be fixed to the semiconductor stack, as a result of which the capacitors and thus also the commutation loops provided by them are mechanically fixedly connected to the semiconductor stack.

In accordance with one embodiment of the invention, the first snubber capacitors together with the second snubber capacitors are connected to one another via a busbar, which can be fixed to the semiconductor stack. Said busbar can be fixed for example directly to an electrically conductive, adjacent heat sink arranged, for example, between two semiconductor switches in the semiconductor stack.

With a plurality of commutation loops, the space around the semiconductor stack can also be better utilized since free spaces can be used for accommodating further capacitors.

BRIEF DESCRIPTION OF THE FIGURES

Exemplary embodiments of the invention are described in detail below with reference to the accompanying figures.

The reference signs used in the figures and their meanings are summarized in the List of reference signs. In principle, identical or similar parts are provided with the same reference signs.

DETAILED DESCRIPTION OF EXEMPLARY EMBODIMENTS

Figure 1:
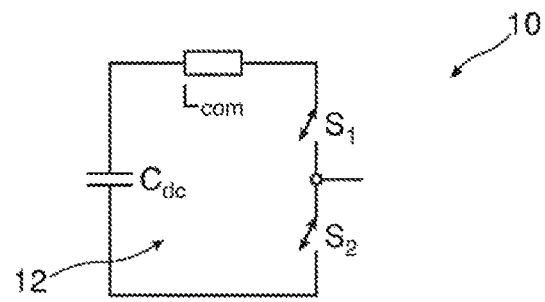
FIG. 1 shows a circuit diagram of a two-level converter.

FIG. 1 schematically illustrates a two-level voltage source converter 10 comprising a commutation loop 12 between two semiconductor switches $S_1$, $S_2$, a capacitor $C_{dc}$ being arranged in said commutation loop. Said loop 12 has a leakage inductance or commutation impedance $L_{com}$.

If a commutation of the current occurs between the two switches, the current i does not fall abruptly owing to the leakage inductance, but rather is temporally dependent, which leads to voltage spikes that load the semiconductor switches. The overvoltage v that occurs is calculated here by $v = L_{com} \cdot di/dt$.

Figure 2:
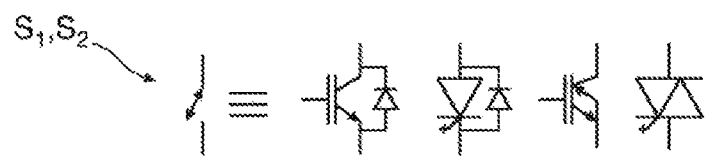
FIG. 2 shows circuit symbols for possible semiconductor switches.

As is illustrated in FIG. 2, the semiconductor switches $S_1$, $S_2$ can comprise for example a transistor, thyristor, IGBT, IGCT, RC-IGBT, RC-IGCT, etc.

Figure 3:
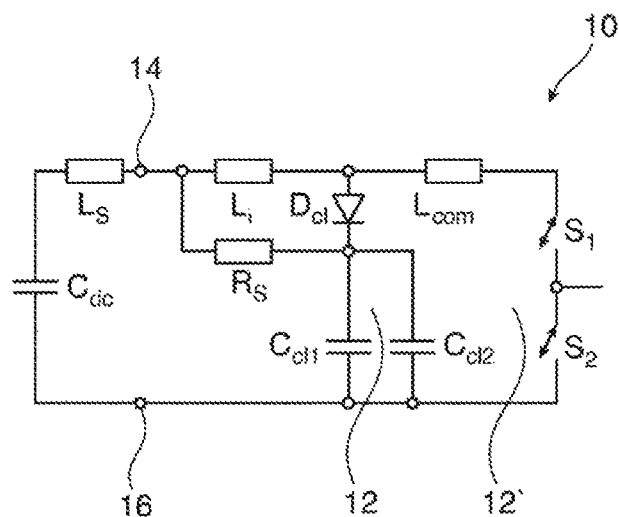
FIG. 3 shows a circuit diagram for a semiconductor stack in accordance with one embodiment of the invention.

FIG. 3 shows a two-level converter 10 comprising further switching components in order to prevent or at least to reduce voltage spikes generated by the leakage inductance $L_{com}$. The circuit shown in FIG. 3 is a so-called RCLD damping circuit. By way of example, the components of the converter apart from the cell capacitor $C_{dc}$ are combined in a common module/stack, wherein the cell capacitor $C_{dc}$ can be connected to the module/stack via terminals 14 and 16.

Firstly, a snubber capacitor $C_{cl1}$ can be connected in parallel with the cell capacitor $C_{dc}$ and in parallel with the series-connected semiconductor switches $S_1$, $S_2$, which is situated in spatial proximity to the two semiconductor switches $S_1$, $S_2$. In this way, the commutation loop 12 is reduced in size and the inductance of the lines is reduced or the inductance $L_s$ is coupled out of the commutation loop 12.

In the case of undamped oscillations (resonances) between the snubber capacitor and the cell or main capacitor $C_{dc}$, a snubber diode (damping diode) $D_{cl}$ and a snubber resistor (damping resistor) $R_s$ can be inserted into the commutation loop 12.

If the turn-off current or its change over time di/dt is intended to be controlled (for example between the diode $D_{cl}$ and the semiconductor switches $S_1$, $S_2$) and/or if at least a portion of the switching losses of the semiconductor switches $S_1$, $S_2$ is intended to be passed into the snubber resistor $R_s$ (for example for IGBTs as semiconductor switches $S_1$, $S_2$), a di/dt inductor inductance (i.e., a choke coil) $L_i$ can be introduced. In this case, the inductance $L_i$ can be inserted between the cell capacitor $C_{dc}$ and one of the semiconductor switches $S_1$, $S_2$. In this case, one end of the resistor $R_s$ can be connected between the cell capacitor and the inductance $L_i$ and/or one end of the diode D.sub.cl can be connected between the inductance $L_i$ and the semiconductor switch $S_1$, $S_2$.

It is also possible for the resistor $R_s$, the inductance $L_i$ and the diode $D_{cl}$ not to be connected to the terminal 14, but rather to the other terminal 16.

In order to reduce the leakage inductance further, not just one snubber capacitor but rather a plurality of parallel-connected snubber capacitors $C_{cl1}$, $C_{cl2}$ can be used, which form a plurality of commutation loops 12, 12'.

Figure 4:
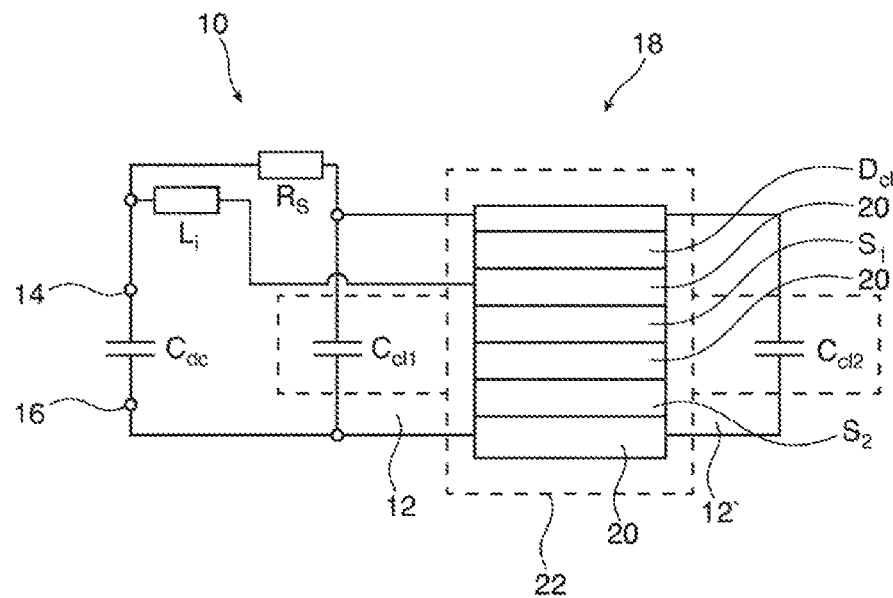
FIG. 4 schematically shows a semiconductor stack in accordance with one embodiment of the invention.

As is shown in FIG. 4, the two semiconductor switches $S_1$, $S_2$ and the diode $D_{cl}$ can be arranged together in a stack 18. In this case a respective cooling element 20 or cooling plate 20 is arranged between two semiconductor components $S_1$, $S_2$.

The stack can comprise a frame 22, by which the components $S_1$, $S_2$, $D_{cl}$ and 20 can be pressed together. A so-called presspack arises in this way.

Figure 5:
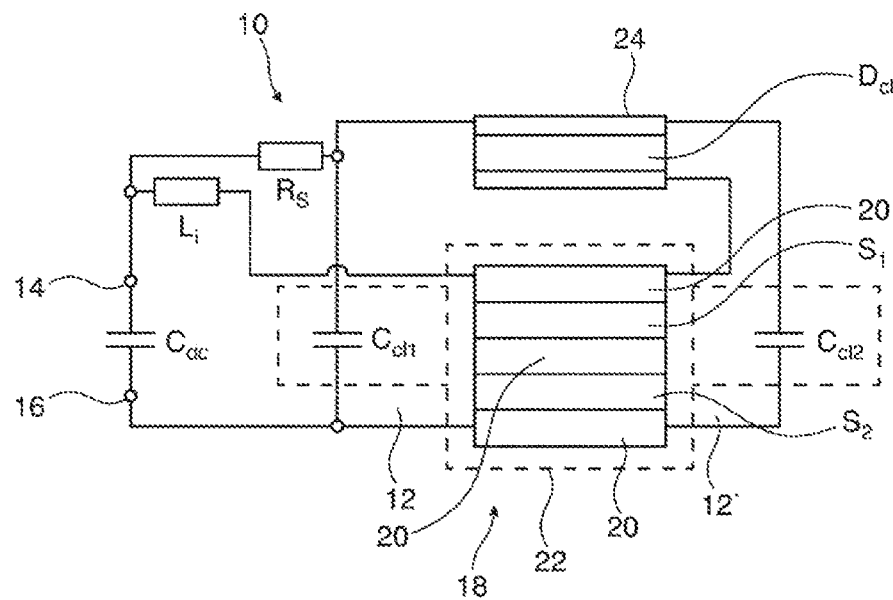
FIG. 5 schematically shows a semiconductor stack in accordance with a further embodiment of the invention.

As is shown in FIG. 5, the diode $D_{cl}$ can also be arranged in an additional stack 24. The stack 18 then comprises only the semiconductor switches $S_1$, $S_2$ and the cooling elements 20.

The stack 18 can be connected to the capacitors $C_{cl1}$ and $C_{cl2}$ and to the other elements $R_s$, $L_i$ by means of cables, lines and/or busbars.

Furthermore, the capacitors $C_{cl1}$ and $C_{cl2}$ and optionally the other components $R_s$, $L_i$ are mechanically connected to the stack 18 and in particular the frame 18 thereof.

In particular, the capacitors $C_{cl1}$ and $C_{cl2}$ arranged at the sides of the stack 18 form two parallel commutation loops 12, 12'.

Figure 6:
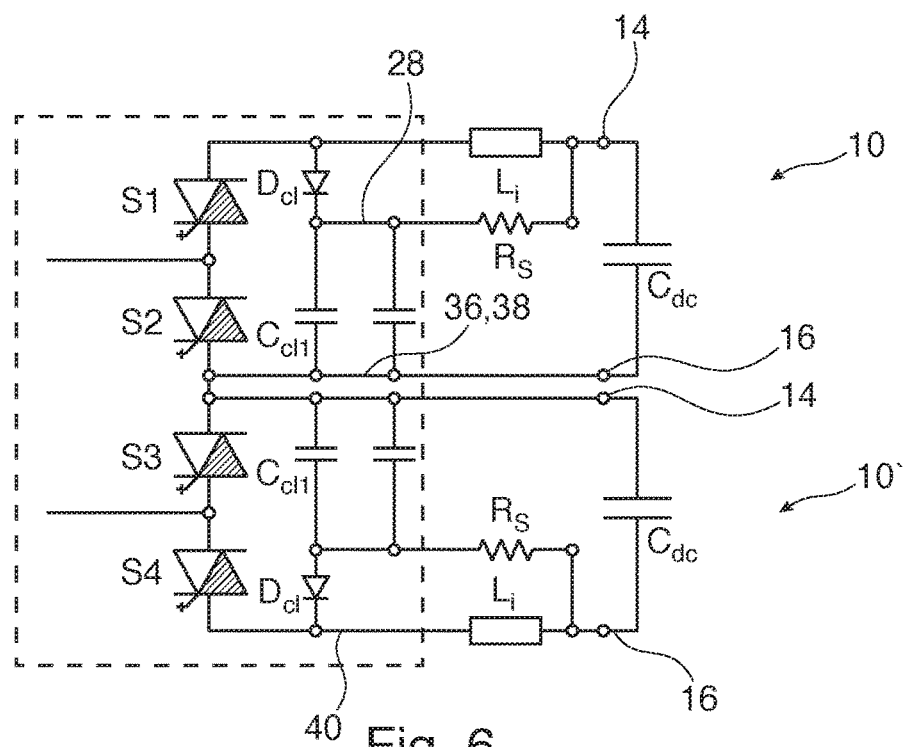
FIG. 6 shows a circuit diagram for a semiconductor stack in accordance with a further embodiment of the invention.
Figure 7:
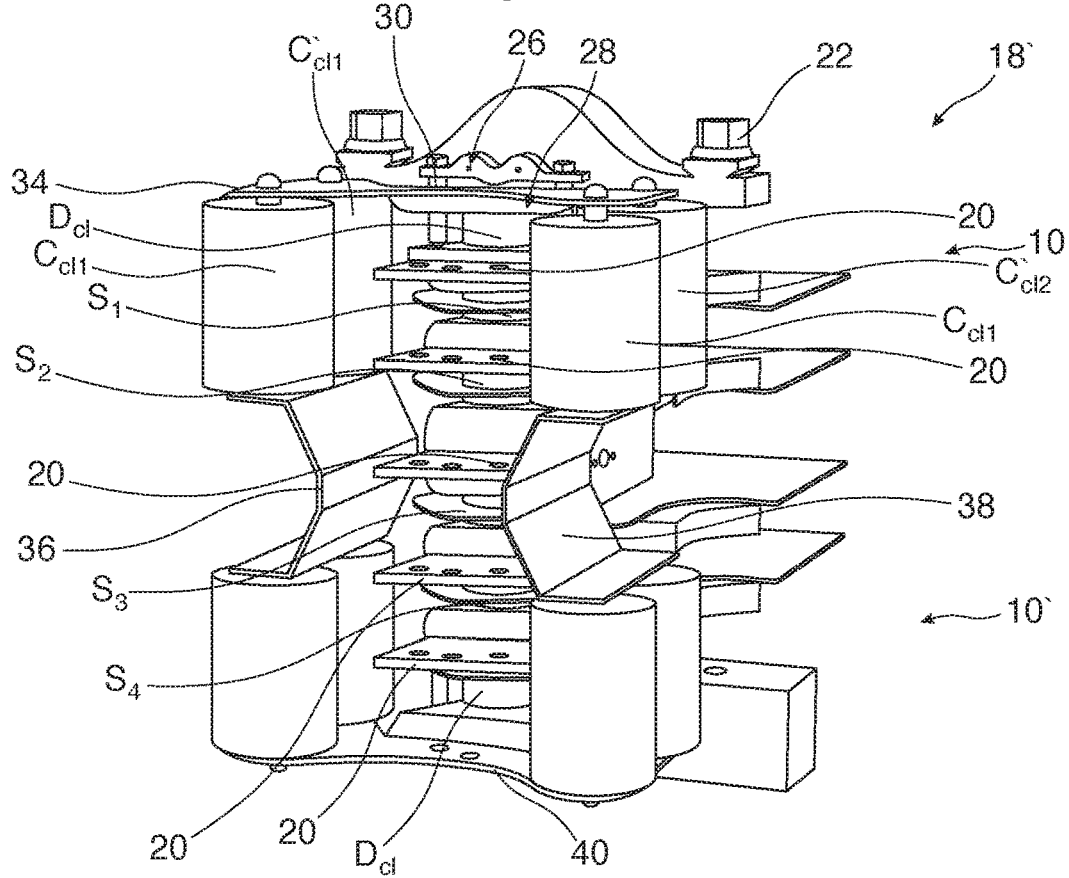
FIG. 7 shows a three-dimensional view of a semiconductor stack in accordance with one embodiment of the invention.

FIG. 6 shows a circuit diagram for the presspack or stack 18 shown in FIG. 7 and comprising two series-connected half-bridges 10, 10' or two-level converters 10, 10'. In the example illustrated, the semiconductor switches $S_1$, $S_2$, $S_3$ and $S_4$ are RC-IGCTs, but can also be RC-IGBTs or IGBTs or IGCTs with diodes.

The semiconductor switches $S_1$, $S_2$, $S_3$ and $S_4$ are connected in series. Moreover, in the converter 10 the diode $D_{cl}$, the inductor $L_i$ and the resistor $R_s$ are connected to the upper, first terminal 14, while in the converter 10' these components are connected to the lower, second terminal 16. In particular, there is no need for any additional insulation between the converters 10 and 10'. The converters 10 and 10' can jointly use a heat sink 20 or a cooling box 20.

Only the components enclosed by a border in FIG. 6 are illustrated in FIG. 7. The snubber diode $D_{cl}$ is connected to the semiconductor stack 18 or a mounting clamp 26. The electrically conductive cooling element 20 between the snubber diode $D_{cl}$ and the semiconductor switch $S_1$ is connected via a conductive connection 28 to an upper, first snubber busbar 34. Spatially parallel to the stack 18, four snubber capacitors $C_{cl1}$, $C_{cl2}$, $C_{cl1}'$, $C_{cl2}'$ are arranged laterally alongside the stack 18 and are connected to the first snubber busbar 34 at an upper end.

In this case, the capacitors $C_{cl1}$, $C_{cl1}'$ are arranged on one side and the capacitors $C_{cl2}$, $C_{cl2}'$ on the opposite side of the stack 18.

At their lower end, the capacitors $C_{cl1}$, $C_{cl1}'$ are connected to a first central snubber busbar 36 and the capacitors $C_{cl2}$, $C_{cl2}'$ are connected to a second central busbar 38. The two busbars 36, 38 are constructed symmetrically with respect to one another and each comprise a metal sheet bent in a U-shaped manner. By the central part, the two busbars are connected to an electrically conductive cooling element 20 between the semiconductor switches $S_2$ and $S_4$.

A lower, second snubber busbar 40 is connected to the diode $D_{cl}$ of the second converter 10'. The capacitors $C_{cl1}$, $C_{cl2}$, $C_{cl1}'$, $C_{cl2}'$ of the lower converter 10' are connected to said diode $D_{cl}$ via a busbar 40 and are arranged in a manner corresponding to the upper capacitors and are correspondingly connected to the central busbars 36, 38.

In FIG. 7, four commutation loops can be discerned for each of the converters 10, 10'.

It should supplementarily be pointed out that "comprising" does not exclude other elements or steps and "a(n)" or "one" does not exclude a plurality. Furthermore it should be pointed out that features or steps that have been described with reference to one of the exemplary embodiments above can also be used in combination with other features or steps of other exemplary embodiments described above. Reference signs in the claims should not be regarded as a restriction.

LIST OF REFERENCE SIGNS

10, 10' Two-level converter
12, 12' Commutation loop
$S_1$, $S_2$ Semiconductor switch
$C_{dc}$ Cell capacitor
$L_{com}$, $L_s$ Leakage inductance
$C_{cl1}$, $C_{cl2}$ Snubber capacitor
$D_{cl}$ Snubber diode
$R_s$ Snubber resistor
$L_i$ Inductor inductance
14, 16 Terminal
18 Semiconductor stack
20 Cooling element
22 Frame
24 Auxiliary stack
$S_3$, $S_4$ Semiconductor switch
26 Mechanical mounting clamp
28 Electrical connection
34 Upper, first snubber busbar
36, 38 Central snubber busbar
40 Lower, second snubber busbar

The invention claimed is:

1. A semiconductor stack for a converter, the semiconductor stack comprising:
    two series-connected semiconductor switches;
    two terminals for connecting a cell capacitor, which are connected to one another by the two semiconductor switches;
    at least one cooling element arranged between the semiconductor switches;
    a frame, by which the semiconductor switches and the cooling element are fixed to one another and which provides the terminals;
    two snubber capacitors which are mechanically fixed to the frame and which are connected in parallel, which are connected to the terminals and which are arranged on opposite sides of the semiconductor stack spatially near the semiconductor switches to form two parallel commutation loops with the semiconductor switches;
    a snubber diode, wherein the parallel-connected snubber capacitors are connected to one end of the two series-connected semiconductor switches via the snubber diode;
    a snubber resistor connected in parallel with the snubber diode; and
    a choke coil which is inserted between the cell capacitor and one of the semiconductor switches and which is used for controlling a change of a turn-off current over time between the snubber diode and the semiconductor switches,
    wherein the two series-connected semiconductor switches, the at least one cooling element, the at least two snubber capacitors, the snubber diode and the snubber resistor are coupled to each other, using the frame, to form a stack.

2. The semiconductor stack as claimed in claim 1, further comprising:
    at least four snubber capacitors which are mechanically fixed to the frame.

3. The semiconductor stack as claimed in claim 2, wherein two snubber capacitors are arranged on opposite sides of the semiconductor stack.

4. The semiconductor stack as claimed in claim 2, wherein two snubber capacitors are arranged spatially alongside one another on one side of the semiconductor stack.

5. The semiconductor stack as claimed in claim 2, wherein the snubber capacitors are embodied such that they are similar with respect to capacitance.

6. The semiconductor stack as claimed in claim 2, further comprising:
    another two series-connected semiconductor switches, the two series-connected semiconductor switches forming a first pair of series-connected semiconductor switches and the another two series-connected semiconductor switches forming a second pair of series-connected semiconductor switches, the first and second pairs of series-connected semiconductor switches for connecting in pairs to two cell capacitors;
the at least two snubber capacitors forming first snubber capacitors which are mechanically fixed to the frame and which are connected in parallel and which in each case form a commutation loop with the first pair of semiconductor switches; and
at least two second snubber capacitors which are mechanically fixed to the frame and which are connected in parallel and which in each case form a commutation loop with the second pair of semiconductor switches.

7. The semiconductor stack as claimed in claim 2, wherein the semiconductor switches are selected from: transistors, thyristors, IGBTs, integrated gate-commuted thyristors, reverse-conducting insulated gate bipolar transistors and reverse-conducting insulated gate-commuted thyristors.

8. The semiconductor stack as claimed in claim 1,
wherein two snubber capacitors are arranged spatially alongside one another on one side of the semiconductor stack.

9. The semiconductor stack as claimed in claim 8, wherein the snubber capacitors are embodied such that they are similar with respect to capacitance.

10. The semiconductor stack as claimed in claim 1, wherein the snubber capacitors are embodied such that they are similar with respect to capacitance.

11. The semiconductor stack as claimed in claim 1, further comprising:
another two series-connected semiconductor switches, the two series-connected semiconductor switches forming a first pair of series-connected semiconductor switches and the another two series-connected semiconductor switches forming a second pair of series-connected semiconductor switches, the first and second pairs of series-connected semiconductor switches for connecting in pairs to two cell capacitors;
the at least two snubber capacitors forming first snubber capacitors which are mechanically fixed to the frame and which are connected in parallel and which in each case form a commutation loop with the first pair of semiconductor switches; and
at least two second snubber capacitors which are mechanically fixed to the frame and which are connected in parallel and which in each case form a commutation loop with the second pair of semiconductor switches.

12. The semiconductor stack as claimed in claim 11,
wherein the first snubber capacitors are connected to one another via a first busbar, the second snubber capacitors are connected to one another via a second busbar, and the first snubber capacitors are connected to the second snubber capacitors via another busbar, wherein the at least one cooling element comprises a heat sink, the another busbar being fixed to the heat sink between the pairs of semiconductor switches.

13. The semiconductor stack as claimed in claim 1,
wherein the semiconductor switches are selected from: transistors, thyristors, IGBTs, integrated gate-commuted thyristors, reverse-conducting insulated gate bipolar transistors and reverse-conducting insulated gate-commuted thyristors.

* * * * *